United States Patent
Baudouin et al.

(10) Patent No.: US 6,373,127 B1
(45) Date of Patent: Apr. 16, 2002

(54) INTEGRATED CAPACITOR ON THE BACK OF A CHIP

(75) Inventors: Daniel Baudouin, Sugar Land; Adin Hyslop, Dallas, both of TX (US); Akitoshi Nishimura, Ibaraki (JP); Jeffrey Janzen, Houston; Mark Kressley, Dallas, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/398,884

(22) Filed: Sep. 20, 1999

Related U.S. Application Data

(60) Provisional application No. 60/102,704, filed on Sep. 29, 1998.

(51) Int. Cl.⁷ ............................................. H01L 23/495
(52) U.S. Cl. ....................... 257/676; 257/691; 257/666; 257/707; 257/719; 257/784; 361/734; 361/723
(58) Field of Search ................................. 257/666, 676, 257/691, 707, 719, 784; 361/734, 723

(56) References Cited

U.S. PATENT DOCUMENTS

| | | | | |
|---|---|---|---|---|
| 5,734,198 A | * | 3/1998 | Stave | 257/666 |
| 6,054,754 A | * | 4/2000 | Bissey | 257/666 |

* cited by examiner

*Primary Examiner*—Minh Loan Tran
*Assistant Examiner*—Luan Thai
(74) *Attorney, Agent, or Firm*—Gary C. Honeycutt; Fred Telecky; Arthur I. Navarro

(57) ABSTRACT

A semiconductor device is disclosed. The device includes an integrated circuit chip having integral de-coupling capacitors on the chip backside. The de-coupling capacitors includes a metal layer in intimate contact with the semiconductor substrate of the integrated circuit, a dielectric layer and a second metal layer. The second metal layer is segmented to form multiple capacitors, and each capacitor is interconnected to power supplies of the chip. Interconnection to different integrated circuit packages is provided. A method of making the semiconductor device is also disclosed.

10 Claims, 4 Drawing Sheets

INTEGRATED CAPACITOR ON THE BACK OF A CHIP

CROSS REFERENCE TO APPLICATIONS

This application is related to co-assigned application Ser. No. 08/863,848 filed May 27, 1997 and to U.S. Pat. No. 5,115,298 granted on May 19, 1992.

This application claim benefit to provisional No. 60/102,704 filed Sep. 29, 1998.

FIELD OF THE INVENTION

This invention is related to an integrated circuit device and more particularly to an integrated circuit with an integral de-coupling capacitor, and to a method of manufacture.

BACKGROUND OF THE INVENTION

As the integrated circuit industry moves toward higher circuit density and larger memory sizes, more stringent requirements are being placed on noise suppression and noise filtering systems which are typically located on the printed circuit board. De-coupling, or bypass capacitors are necessary to provide a temporary supply of charge to the integrated circuit as the output of power supplies connected to the integrated circuit varies. In this way, circuit operation is not compromised due to a temporary drop in voltage supply. To enhance de-coupling, these bypass capacitors need to be as close to the device as possible in order for the inductance between the capacitors and devices to be as small as possible.

Integrated circuits of higher densities and larger memory sizes have thinner dielectric between their internal interconnect levels. As such, those circuits are much more susceptible to damage from noise spikes on power lines of the power supplies.

As the circuits have increased the number of power supplies has also increased resulting in a need for more capacitors with greater values. Moreover, as frequency handling characteristics differ for different capacitors, a single capacitor cannot handle both low end frequency and high end frequency noise suppression adding further to the need for multiple capacitors, which In turn results in increasing the circuit board space required.

Attempts have been made to conserve board space and to bring capacitors closer to the integrated circuit devices by incorporating capacitors within the IC package. FIG. 1a illustrates a cross section of a conventional package in which an integrated circuit chip 11 is wire bonded 14 to a leadframe 13, and is encapsulated by a molded polymer 18. An inside view of the package is shown in FIG. 1b, including a leadframe 13, a semiconductor device 11 represented by dashed lines adhered to a mount support pad 12, and power supply busses 16 and 17. Power supply bus 16 delivers Vss and power supply bus 17 delivers Vdd. The power supply busses are physically spaced apart, and the de-coupling capacitor 19 lies underneath the mount pad 12. The capacitor is a long terminal device having its electrodes connected between Vss 16 and Vdd 17. This does not provide a practical solution to the problem at hand because only one capacitor can be included in the package, and because the long device can cause reliability problems from undue stresses on the encapsulating plastic, and on the capacitor itself.

FIG. 2 shows an alternate approach of prior art having a de-coupling capacitor within the semiconductor package. The backside of the semiconductor chip 21 is used as one electrode of the de-coupling capacitor and the leadframe mount pad 22 becomes the second terminal. A lead 24 is connected directly to the mount pad 22 for external contact. The chip is wire bonded to the leads 23, one of which will be the external contact for the first terminal. An adhesive (not shown) may become the dielectric between the terminals. This approach would require a leadframe designed specifically for the device wherein the mount pad is connected to Vdd or alternately to Vss (depending on the chip doping). It could be applicable only to conventional packaging in which the chip is attached to a leadframe using an electrically insulating adhesive which lacks the thermal conductivity of metal filled mount compounds typically used in the industry. While the value of the capacitor could be large with this approach, it is limited to a single capacitor per semiconductor package.

Yet another approach for incorporating de-coupling capacitors in a lead-on-chip semiconductor device has been disclosed in U.S. Pat. No. 5,115,298 issued May 19, 1992 and is incorporated herein by reference. As demonstrated in FIGS. 3a and 3b the active surface of a semiconductor chip 31 is adhered by an insulating tape 33 to a leadframe having power supply busses Vdd 36 and Vss 37 which are parallel and extend the length of the lead frame in close proximity to each other. Electronic devices 39, such as capacitors, are attached to Vdd and Vss near the ends of the power supply busses. By choosing the capacitance of each device, both high end and low end frequency noise suppression can occur simultaneously.

As integrated circuit applications have evolved, much smaller and thinner devices are required. It would be advantageous to provide a reliable means for incorporating de-coupling capacitors into the integrated circuit package. It would be highly desirable that the capacitors require no additional space, and are amenable with evolving packaging and interconnection advances.

SUMMARY OF THE INVENTION

A semiconductor device is disclosed which includes an integrated circuit chip having a integral de-coupling capacitor on the backside of the chip, and which is a part of the chip itself.

The primary objective of the invention is to provide an integral de-coupling capacitor on the backside of the chip including a metal layer, a high dielectric constant layer, and a second layer of metal.

A further object of the invention is to provide multiple integral de-coupling capacitors on an integrated circuit chip.

It is still a further object of the invention to provide de-coupling capacitors which require no additional space on the printed circuit board, and which impart no significant mechanical stresses on the integrated circuit chip, package, or the capacitor itself.

It is an object of this invention to provide integral de-coupling capacitor with high capacitance value.

It is an object of this invention to provide a reliable de-coupling capacitor having an inorganic dielectric which is not hygroscopic.

It is an object of this invention to provide an integrated circuit device having improved thermal dissipation, and having an integral de-coupling capacitor on the backside of the chip.

Yet another object of this invention is to provide a semiconductor device having an integral de-coupling capacitor on the backside of an integrated circuit chip, and the chip with integral capacitors assembled into different package types; conventional leadframes and lead-on-chip molded packages, and board-on-chip ball grid array packages are exemplary.

The integral de-coupling capacitor includes a first layer of metal in intimate contact with the semiconductor substrate of an integrated circuit, a layer of high dielectric constant material, and a second metal layer. The second or exposed metal layer is contacted to a power supply on the integrated circuit. Multiple capacitors are formed by scribing the second metal layer and contacting each capacitor to a power supply of the integrated circuit. High capacitance values are made possible as a function of their large area. Effective capacitors result from close proximity to the active circuits, and by eliminating high inductance interconnections.

A cost effective method for making the integrated circuit chip with integral de-coupling capacitors, and for assembly into different package types is also disclosed.

The drawings constitute a part of this specification and include exemplary embodiments to the invention which may be embodied in various forms. It is to be understood that in some instances aspects of the invention may be shown exaggerated or enlarged to facilitate an understanding of the invention.

DETAILED DESCRIPTION OF THE PREFERRED EMBODIMENTS

Figure 4:
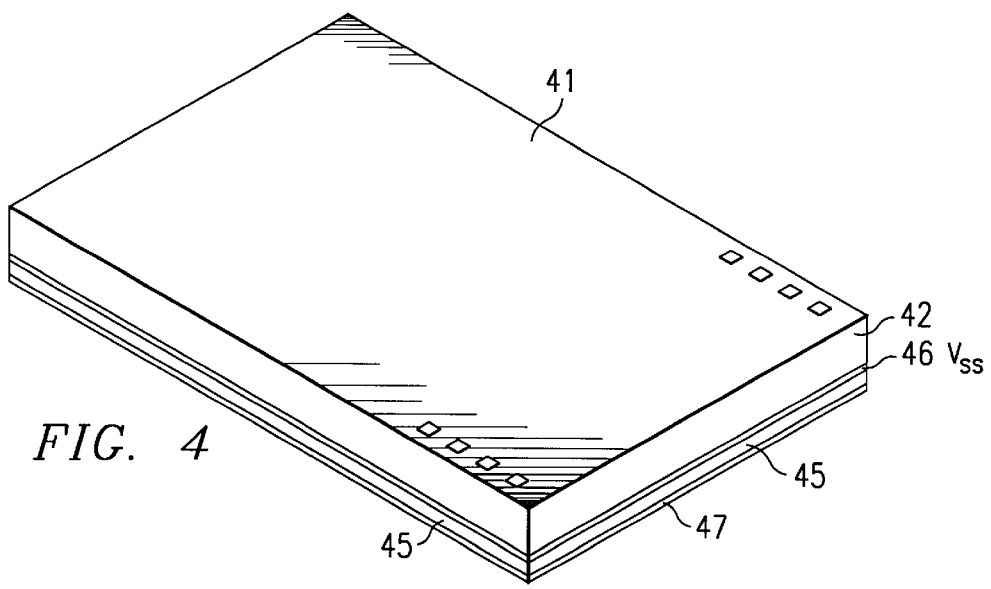
FIG. 4 shows an integrated circuit having an integral de-coupling capacitor on a chip backside.

Turning now to the drawings which describe the current invention. In FIG. 4 there is shown an integrated circuit chip having an integral de-coupling capacitor on the backside of the chip. The term integral de-coupling capacitor is intended to imply a complete high capacitance value capacitor formed directly on the chip, and which is a part of the chip itself. The device includes an active surface of the integrated circuit 41 having a silicon substrate 42. The capacitor includes a first metal layer 46 which is in intimate contact with the semiconductor substrate, a dielectric layer 45 covering the first metal layer, and a second metal layer 47 over the dielectric. A first metal layer 46 disposed on the clean, oxide free substrate of a chip provides one electrode of the capacitor. A layer of a material having a high dielectric constant 45 completely covers the first metal 46, and a second layer of metal 47 covers the dielectric to complete the formation of a capacitor. The second metal 47 will be connected to a power supply on the chip. The first metal layer 46 of the capacitor is in intimate contact with the semiconductor substrate of the chip and is connected directly from a bonding pad or pads on the chip surface. Interconnections to the chip backside are required only to connect the second metal 47 terminal of the integral capacitor.

The integral de-coupling capacitor on the backside of a chip eliminates inductive leads and places the capacitor in very close proximity to the circuit wherein the noise was generated, and thereby becomes a highly effective de-coupling capacitor. Further, it requires no additional space either within the package or on the circuit board, as was the case with prior art. Thermally conductive metal layers on the chip backside provide thermal spreading over the entire chip area as well as a means to dissipate heat from the chip backside.

In order to provide a reliable capacitor, the dielectric 45 is pin hole free and has dielectric constant capable of providing the required capacitance for the integrated circuit, typically in the range of 0.5 to 2 micro-farads. A material, such as Barium Strontium Titanate with capacitance of 10 femto-farads per micrometer square is well suited to chip sizes of interest. Thickness of the dielectric layer is in the range of 100 to 1000 angstrom units.

Other materials which are suitable for this application include tantalum oxide, titanium dioxide or oxides of hafnium, niobium, zirconium and aluminum. The inorganic dielectric materials have low expansion coefficients which are compatible with the silicon substrate, and are not hygroscopic as may be the case with organic substances.

The first metal 46 of the integral capacitor is protected from the environment by the dielectric layer 45, and it requires no external contact or exposure. Metal one may comprise a conductive metal such as aluminum, or a more noble metal such as gold, platinum, or iridium. On the other hand, the second metal layer 47 is exposed to environmental contamination, and comprises a noble metal such as gold, platinum or iridium in order to avoid corrosion or oxidation. The highly conductive metals are in the range of 100 to 5,000 angstroms thick.

Figure 5:
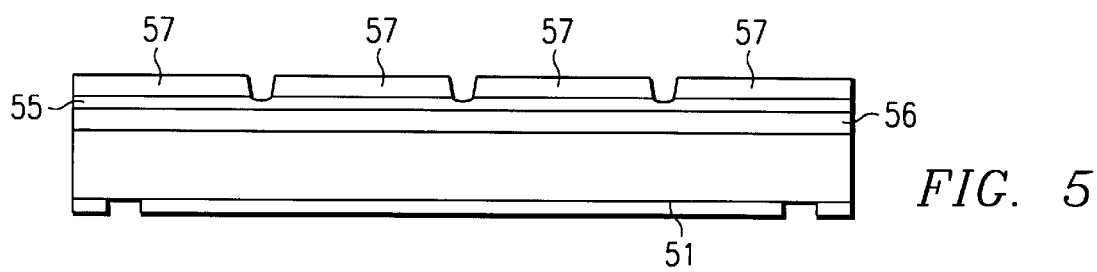
FIG. 5 shows a cross section of an integrated circuit having multiple integral de-coupling capacitors on a chip backside.

A single integral capacitor includes a first metal layer 46, a dielectric layer 45, and a second metal layer 47 on a chip backside. Multiple capacitors are provided on a chip by a segmenting the second metal layer. FIG. 5 shows a cross sectional view of an integrated circuit chip having multiple capacitors. The device includes a first surface 51 having integrated circuits, and a second surface on which a first metal layer 56 covers substantially all of the semiconductor substrate, a dielectric 55 layer which covers the first metal layer, and a second metal layer 57 which is segmented to form multiple capacitors. The first metal terminal of the capacitors is in intimate contact with the integrated circuit substrate, and each of the segments of the second metal will have a contact to a power supply of the integrated circuit.

The thickness of the dialectical layer, its dielectric constant and the area of the capacitor determine the capacitance value of a capacitor. For integral capacitors on a chip backside, the value of each capacitor is differentiated from the others by its area. In the preferred embodiment of this invention, a device having multiple capacitors, one or more capacitors are provided to suppress low frequency noise and others to suppress voltage spikes. The preferred embodiment of an integral de-coupling capacitor on an integrated circuit chip includes a dynamic random access memory (DRAM) circuit. Typically DRAM circuits have their substrate at ground which provides contact with the first terminal of the integral capacitor of this invention, and the second metal of the capacitor will be connected to Vdd power supplies on the chip.

Multiple packaging options for these circuits exist in the industry, and have in common the need for maximum circuit density and for very thin packages. DRAM package types include encapsulated conventional SOJ leaded packages, lead-on-chip (LOC) packages, and board-on-chip (BOC) packages with ball grid interconnections. The chips are available with either perimeter or center bond pads and the chip interconnections may be either by wire bond or by direct chip attach such as flip chip solder bails.

Figure 6A:
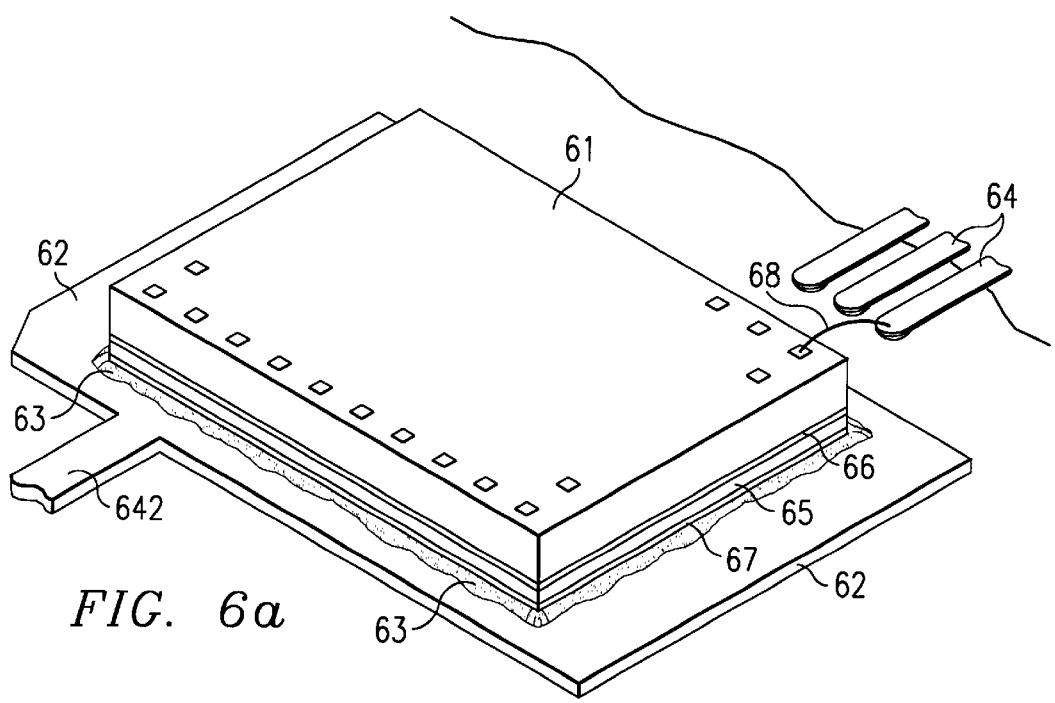
FIG. 6a shows an integral de-coupling capacitor on a chip attached to a die mount pad.

FIG. 6a shows partial view of a conventional leadframe having a die mount pad 62, and a plurality of lead fingers 64. An integrated circuit chip 61 having an integral de-coupling capacitor on the chip backside is interconnected through the die mount pad 62 to Vdd at lead 66. The integral de-coupling capacitor including a first layer of metal 66 on the backside of an integrated circuit chip 61, a dielectric layer 65, and a second layer of metal 67 which is electrically connected to the die mount pad 62 by a conductive adhesive 63. Lead 642 attached directly to the die pad 643 provides Vdd external contact. The integrated circuit at ground is connected to an external Vss contact by wire bond between the bond pad on the chip surface and its designated lead finger.68.

While this package is implied to be an encapsulated package having a separate leadframe, a ceramic or other cavity package having a die mount pad and a plurality of leads is equally applicable.

Figure 6B:
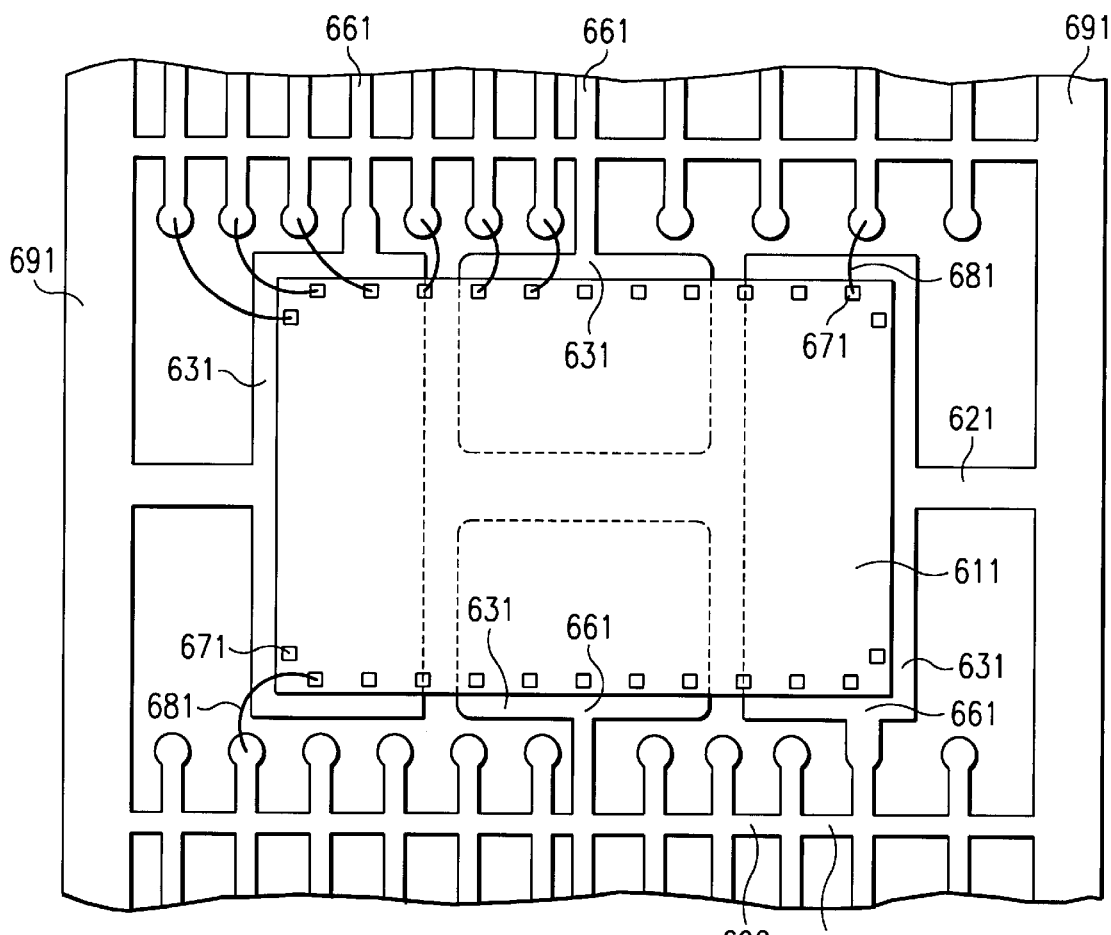
FIG. 6b shows a leadframe having a segmented die pad with a chip having integral de-coupling capacitors on the backside.

Turning now to applications of multiple de-coupling capacitors on a chip backside, FIG. 6b provides a lead frame having a segmented die mount pad whereby a Vdd interconnections can be made to each of the multiple de-coupling capacitor on the backside of an integrated circuit chip. Multiple capacitors are particularly advantageous to integrated circuits having different power supplies and requirements.

The integrated circuit chip 611 contacts each segment of the die pad 631 by a conductive adhesive (not shown), and thereby provides contact to the second or exposed metal layer of the integral de-coupling capacitor by leads attached directly to the die pad. Vss bond pad terminals 671 on the chip surface are wire bonded 681 to their respective pads. Transport rails 691, tie straps 621 and lead support rails 692 necessary for supporting the segmented mount pad will be removed after the device has been encapsulated.

Figure 1A:
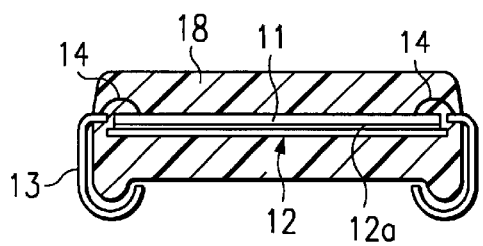
FIG. 1a is a cross section of a conventional integrated circuit package. (Prior art)
Figure 1B:
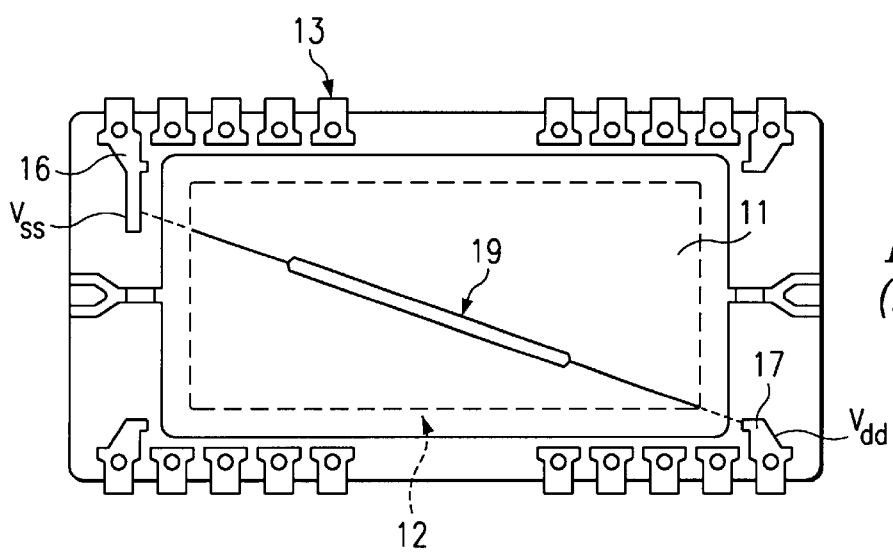
FIG. 1b is a partial top view of a device having a capacitor connected across power supply leads Vss and Vdd.
Figure 2:
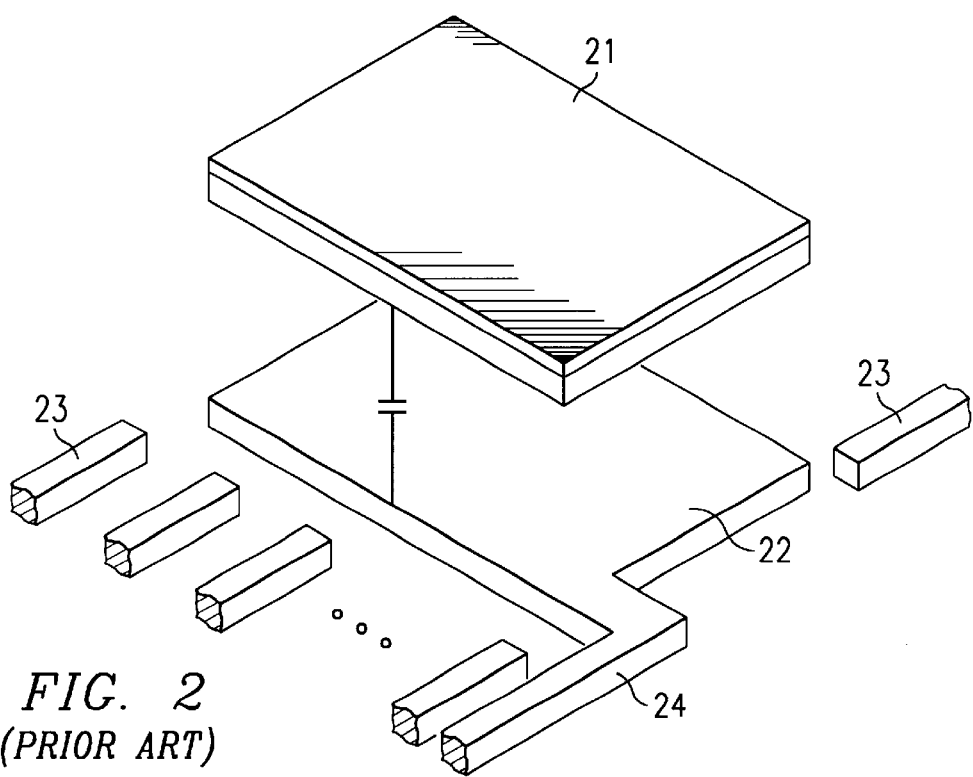
FIG. 2 demonstrates an integrated circuit device having the leadframe mount pad and the chip backside as capacitor terminals. (Prior art)
Figure 3A:
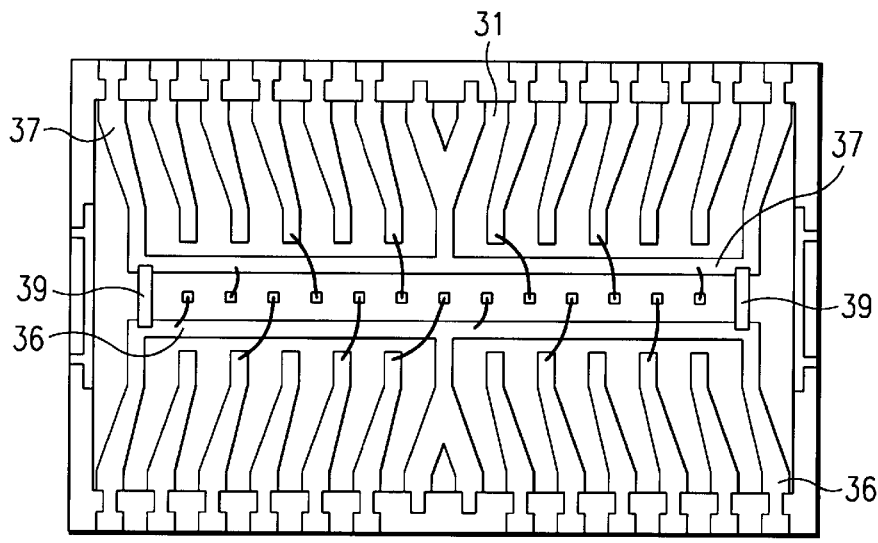
FIG. 3 shows a LOC device having two de-coupling capacitors within the package. (Prior art)
Figure 3B:
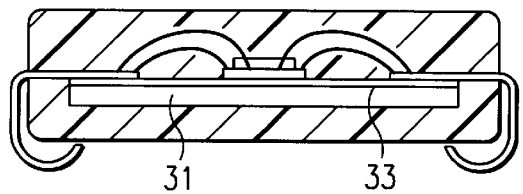

DRAM devices are frequently offered in LOC (Lead-on-chip) packages. Referring back to FIG. 3, the LOC leadframe includes Vdd and Vss busses which extend the length of the chip, and a plurality of lead fingers which are attached to the chips active surface by an insulating film and adhesive. Bond pad terminals on the chip surface located centrally on the device are typically wire bonded to the busses and to the lead fingers.

Figure 7:
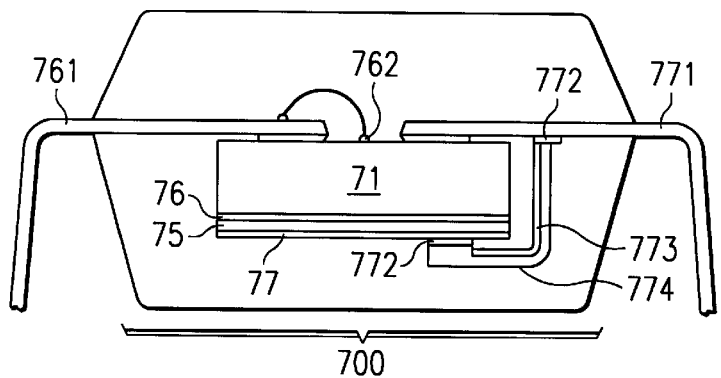
FIG. 7 shows a cross section of a LOC package with a chip having a de-coupling capacitor on the backside.

Referring again to FIG. 3, each end of the long parallel busses terminates in an external lead at or beyond the chip's end. The large end leads of the busses provide ready access to contact the second metal layer capacitor terminals of a device having an integral de-coupling capacitor on the chip backside. FIG. 7 shows an embodiment of the present invention in an encapsulated LOC package 700 from a cross sectional view and near the end of the device. The integrated circuit chip 71 has a first layer of metal 76, a dielectric layer 75, and a second layer of metal 77 which form an integral de-coupling capacitor on the chip backside. The second metal 77 terminals are interconnected to the Vdd bus lead 771 at the end of the chip by a flexible connectors with metal terminals 772 on either end. The metal terminals 772 of the flex connector are soldered or adhered by conductive adhesive to the second or exposed metal layer 77 of the de-coupling capacitor, and to the underside of Vdd bus leads 771 on either end of the package. The electrical contact to the bus lead is beyond the chip short side edge, and is within the package. A flex connector typically includes a Kapton or other polymer base 773 which will be placed facing the chip edge to avoid shorting to the copper film 774. The copper or other conductive film 774 terminates in ends which are tinned in order to provide a solderable surface. Vss contacts are made between the Vss bond pads 762 on the chip surface and the Vss bus lead 761.

Figure 8A:
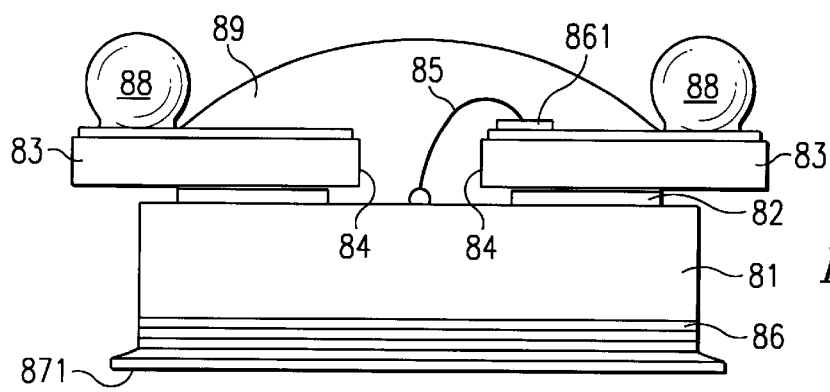
FIG. 8a shows a cross section of a BOC package having a chip with de-coupling capacitor on the backside.
Figure 8B:
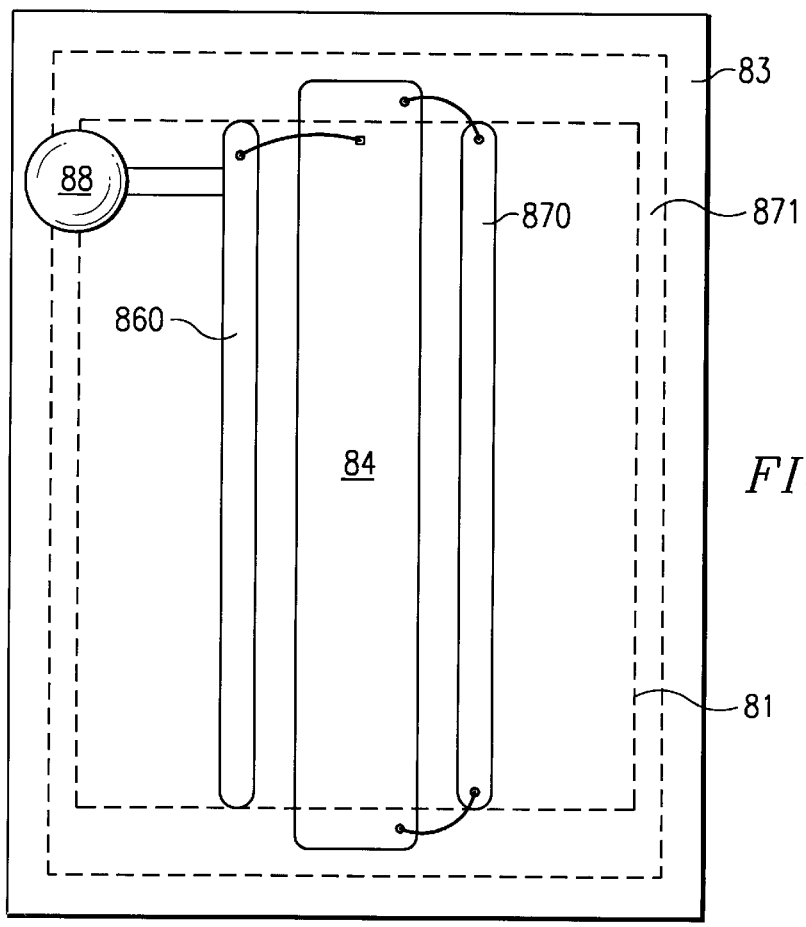
FIG. 8b shows a top view of a BOC package with a chip having a de-coupling capacitor on the backside.

Yet another exemplary DRAM package is a (BOC)Board-on-Chip Package which takes advantage of solder ball external contact terminals, and provides a small package outline. This package has been disclosed previously in U.S. Pat. application Ser. No. 08/863,848 filed May 27, 1997 and is incorporated herein by reference. An embodiment of an integral de-coupling capacitor of the current invention in a BOC package is shown in FIGS. 8a and 8b. The active surface of the chip 81 is adhered by an adhesive 82 to a thin printed wiring board 83 having an slot opening 84 in the center of the board for wire bond 85 to interconnect between the center bond pads of the chip, and circuitry on the board. Solder balls 88 near the perimeter of the board provide external contacts. The chip with interconnections is protected by a polymeric encapsulation 89 or by molding.

A first layer of metal 86 of the de-coupling capacitor is interconnected from the bond terminals to a Vss bus 861 on the board circuitry. Metal layer 87 of the de-coupling capacitor is bonded electrically to a metal plate 871 which is longer than the chip. In FIG. 8b, a top view of the circuit board 83 shows interconnections from the Vdd bus 870 on the board circuitry to the metal plate 871 attached to the chip backside through the slot 84 in the circuit board. The slot 84 in the circuit board is longer than the chip so that contact can be made through the slot to the metal plate 871 attached to the chip backside. Vss bond pad terminals are interconnected to a Vss bus 860 by wire bonds.

The BOC package as disclosed in patent application, U.S. patent application Ser. No. 08/863,848, as having either wire bond or flip chip interconnections to the board. The device of this invention, a integral de-coupling capacitor on a chip backside, is applicable to either chip interconnection type. For flip chip applications, the exposed metal layer of each capacitor on the chip backside will be contacted by a soldered flex connection as described in FIG. 7.

In summary, an integral capacitor is provided on an integrated circuit chip which includes a metal layer, a dielectric layer, and a second metal layer disposed on the backside of the chip. The first metal terminal of an integral de-coupling capacitor of the preferred embodiment of this invention contacts the semiconductor substrate at ground, and the second metal layer of the capacitor is interconnected to a power supply or power supplies on the chip. Multiple capacitors are provided by scribing the second or outer metal layer and connecting each segment to a power supply on the chip.

Further, a number of integrated circuits devices are provided including an integral de-coupling capacitor on a chip backside packaged in molded packages having a die pad, lead-on-chip packages and in a board on chip package.

Turning now to a low cost method of fabricating an integral de-coupling capacitor on a chip backside. Following processing of the active circuits on a semiconductor wafers and thinning the wafer to its designated thickness, the wafer is cleaned of contamination and oxides. A thin film layer of metal not unlike that used in the processing of integrated circuits, such as aluminum or platinum, is applied to the wafer backside by vapor deposition. Thickness of the metal is in the range of 100 to 5000 angstrom units. A dielectric material, having a high dielectric constant, such as barium strontium titanate is deposited in an oxidizing atmosphere. The dielectric layer completely covers the first metal layer. Other materials, such as titanium dioxide, or tantalum oxide are suitable materials. Thickness of the dielectric is in the range of 100 to 1000 angstrom units, as determined by the capacitance value needed. The next process step provides that a second metal layer is vapor deposited over the dielectric on the wafer backside. The second thin film metal layer may is preferably a noble metal such as gold or platinum.

The semiconductor wafer having a capacitor including a first metal layer, a dielectric layer, and a second metal layer on the backside is scribed into individual devices using a diamond saw. In an embodiment having a single capacitor on an integrated circuit chip, the diced wafer is ready for assembly into a package as previously shown in FIGS. 6, 7, and 8.

In a preferred embodiment having multiple capacitors on the chip backside, a precision diamond saw is programmed to scribe only through the second metal layer at designated locations on the wafer. The size is set to provide capacitors of the designated capacitance. The surface of the dielectric layer may be only partially scored during the metal scribing, but may not be completely penetrated. After the second metal has been scribed, the wafer is diced into individual chips and packaged as needed by the user, and as described in FIGS. 6b, 7 and 8.

The preferred method of forming an integral capacitor on an integrated circuit as described requires no costly photolithographic steps. While this simpler method is preferred, it is also possible to form multiple capacitors by photopatterning and etching the second metal.

An integrated circuit having an integral de-coupling capacitor on the chip backside is assembled into a package as described in FIGS. 6 through 8, or other embodiments which will be apparent to persons skilled in the art.

While the invention has been described in connection with preferred embodiments, it is not intended to limit the scope to a particular form set forth, but on the contrary, it is intended to cover alternatives, modifications, and equivalents as may be included within the spirit of the invention and scope of the invention as defined by the appended claims.

What is claimed is:

1. A semiconductor device having a chip substrate that forms the backside of the chip, said device including:
   a) an integrated circuit chip having an integral de-coupling capacitor on the backside of said chip,
   b) said capacitor comprising a first thin film metal layer 100 to 5000 Angstroms thick, a dielectric layer 100 to 1000 Angstroms thick; and a second thin film metal layer,
   c) said capacitor interconnected to said chip by direct contact of the first metal layer to the semiconductor substrate, and the second metal layer to a power supply on the chip.

2. A semiconductor device as in claim 1 wherein the capacitor is confined within the area of said integrated circuit chip.

3. A semiconductor device as in claim 1 wherein said first and second metal layers of the capacitor provide improved thermal dissipation to said integrated circuit.

4. A semiconductor device having a chip substrate that forms the backside of the chip, said device including:
   a) an integrated circuit chip having an integral de-coupling capacitor on the backside of said chip,
   b) said capacitor comprising a first thin film metal layer 100 to 5000 Angstroms thick, a dielectric layer 100 to 1000 Angstroms thick, and a second thin film metal layer,
   c) said capacitor interconnected to said chip by contact of the first metal to the semiconductor substrate, and the second metal to a power supply on the chip;
   d) said capacitor is confined within the area of said integrated circuit chip; and
   e) improved thermal dissipation provided by the first and second metal layers of said capacitor.

5. A semiconductor device including:
   a) an integrated circuit chip having multiple integral de-coupling capacitors on the backside of said chip,
   b) said capacitors comprising a first thin film metal layer 100 to 5000 Angstroms thick, a dielectric layer 100 to 1000 Angstroms thick, and a second thin film metal layer;
   c) each of said capacitors interconnected to said chip by contact of the first metal to the semiconductor substrate, and the second metal to a power supply on the chip.

6. A semiconductor device as in claim S wherein said capacitors are confined within the area of said integrated circuit chip.

7. A device as in claim 5 wherein one of said capacitors suppresses low frequency noise and another suppresses voltage spikes.

8. A semiconductor device including:
   a) an integrated circuit chip having multiple integral de-coupling capacitors on the backside of said chip,
   b) said capacitors comprising a first thin film metal layer 100 to 5000 Angstroms thick, a dielectric layer 100 to 1000 Angstroms thick, and a second metal thin film layer,
   c) each of said capacitors interconnected to said chip by contact of the first metal to the semiconductor substrate, and the second metal to a power supply on the chip;
   d) said capacitors are confined within the same area as said integrated circuit chip; and
   e) improved thermal dissipation provided by the first and second metal layers of the capacitor.

9. A semiconductor device including:
   a) an integrated circuit chip having an integral de-coupling capacitor on the backside of said chip,
   b) said capacitor comprising a first metal layer, a dielectric layer, and a second metal layer,
   c) said capacitor interconnected to said chip by contact of the first metal layer to the semiconductor substrate, and the exposed second metal to a power supply on the chip; and d) a semiconductor package including a leadframe having a die mount pad and a plurality of leads wherein one terminal of said the integral capacitors electrically contacts said die mount pad, and the second terminal is connected to a power supply contact on the integrated circuit.

10. A semiconductor device including:

a) an integrated circuit chip having integral de-coupling capacitors on the backside of said chip, b) each of said capacitors comprising a first metal layer, a dielectric layer, and a second metal layer, c) each of said capacitors interconnected to said chip by contact of the first metal layer to the semiconductor substrate, and the exposed second metal to a power supply on the chip; and d) a semiconductor package including a leadframe having a multiple die mount pads and a plurality of leads wherein one terminal of each of said the integral capacitors electrically contacts one of said die mount pads, and the second terminal is connected to a power supply contact on the integrated circuit.

* * * * *